(12) United States Patent
Chen et al.

(10) Patent No.: US 10,073,496 B2
(45) Date of Patent: Sep. 11, 2018

(54) HINGE FOR A FOLDABLE DISPLAY UNIT

(71) Applicant: HEWLETT-PACKARD DEVELOPMENT COMPANY, L.P., Houston, TX (US)

(72) Inventors: Wei-Chung Chen, Taipei (TW); Kuan-Ting Wu, Taipei (TW); Wen-Hua (Jerry) Ni, Taipei (TW)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 15/563,983

(22) PCT Filed: Jun. 26, 2015

(86) PCT No.: PCT/US2015/037878
§ 371 (c)(1),
(2) Date: Oct. 3, 2017

(87) PCT Pub. No.: WO2016/209247
PCT Pub. Date: Dec. 29, 2016

(65) Prior Publication Data
US 2018/0136700 A1  May 17, 2018

(51) Int. Cl.
*G06F 1/16* (2006.01)
*E05D 7/00* (2006.01)
(Continued)

(52) U.S. Cl.
CPC .............. *G06F 1/1681* (2013.01); *E05D 3/06* (2013.01); *E05D 7/00* (2013.01); *F16C 11/04* (2013.01);
(Continued)

(58) Field of Classification Search
CPC .. G06F 1/1681; G06F 1/1652; H04M 1/0268; E05D 3/06; E05D 7/00; H05K 5/0226; E05Y 2900/606; F16C 11/04
See application file for complete search history.

(56) References Cited

U.S. PATENT DOCUMENTS 8,738,101 B1  5/2014  Myr
8,787,016 B2  7/2014  Rothkopf et al.
(Continued)

FOREIGN PATENT DOCUMENTS

JP  2010-218102 A  9/2010
KR  10-2008-0035709 A  4/2008
(Continued)

OTHER PUBLICATIONS

Darren Murph, "Conceptual Flexi PDA Boasts Rubber Hinges, Flexible Display," May 16, 2007, pp. 1-3, engadget.com.

*Primary Examiner* — James Wu
(74) *Attorney, Agent, or Firm* — HPI Patent Department

(57) ABSTRACT

Examples disclosed herein provide a hinge for a foldable display unit. One example hinge includes a plurality of brackets. A bracket from the plurality of brackets is to operably couple to an adjacent bracket from the plurality of brackets, to be folded into an arcuate shape. The hinge further includes a plurality of links to operably couple the plurality of brackets to each other. A first end of a first link from the plurality of links is rotatably connected to an end of a second link from the plurality of links according to a first frictional value. A second end of the first link is rotatably connected to an end of a third link from the plurality of links according to a second frictional value less than the first frictional value.

15 Claims, 2 Drawing Sheets

(51) Int. Cl.
*E05D 3/06* (2006.01)
*F16C 11/04* (2006.01)
*H05K 5/02* (2006.01)
*H04M 1/02* (2006.01)

(52) U.S. Cl.
CPC ...... *G06F 1/1652* (2013.01); *E05Y 2900/606* (2013.01); *H04M 1/0268* (2013.01); *H05K 5/0226* (2013.01)

(56) References Cited

U.S. PATENT DOCUMENTS

| | | | |
|---|---|---|---|
| 8,813,312 B2 | 8/2014 | Song et al. | |
| 9,173,287 B1 * | 10/2015 | Kim | H05K 1/028 |
| 9,506,279 B2 * | 11/2016 | Kauhaniemi | G06F 1/1652 |
| 9,606,583 B2 * | 3/2017 | Ahn | G06F 1/1681 |
| 9,625,947 B2 * | 4/2017 | Lee | G06F 1/1616 |
| 9,811,119 B2 * | 11/2017 | Seo | G06F 1/1652 |
| 9,818,961 B2 * | 11/2017 | Hiroki | H01L 51/0097 |
| 9,898,051 B2 * | 2/2018 | Cho | G06F 1/1681 |
| 9,927,841 B2 * | 3/2018 | Gheorghiu | G06F 1/1652 |
| 2007/0117600 A1 | 5/2007 | Robertson, Jr. | |
| 2010/0246113 A1 | 9/2010 | Visser et al. | |
| 2012/0307423 A1 * | 12/2012 | Bohn | G06F 1/1641 361/679.01 |
| 2013/0070431 A1 | 3/2013 | Fukuma et al. | |
| 2014/0196254 A1 | 7/2014 | Song | |
| 2015/0077917 A1 | 3/2015 | Song | |
| 2016/0116944 A1 * | 4/2016 | Lee | H04M 1/022 361/679.26 |
| 2016/0349802 A1 * | 12/2016 | Ahn | G06F 1/1641 |
| 2017/0303414 A1 * | 10/2017 | Chu | H05K 5/0017 |

FOREIGN PATENT DOCUMENTS

| | | |
|---|---|---|
| KR | 10-2011-0100936 A | 9/2011 |
| KR | 10-1389442 B1 | 4/2014 |
| KR | 10-1452867 B1 | 10/2014 |
| KR | 10-1487189 B1 | 1/2015 |
| KR | 10-2015-0037383 A | 4/2015 |

* cited by examiner

HINGE FOR A FOLDABLE DISPLAY UNIT

BACKGROUND

The emergence and popularity of mobile computing has made portable computing devices, due to their compact design and light weight, a staple in today's marketplace. Smartphones, tablet computers, and all-in-one devices are examples of portable computing devices that are widely used. Such devices generally employ a touchscreen on a display surface of the device that may be used for both viewing and input. Users of such devices may interact with the touchscreen via finger or stylus gestures.

BRIEF DESCRIPTION OF THE DRAWINGS

FIGS. 2A-8 illustrate components of the foldable display unit in the folded and unfolded state, respectively, for operably coupling a plurality of brackets to each other, according to an example.

DETAILED DESCRIPTION

In the efforts of building compact portable computing devices, various ways of scaling down sizes of such devices have been devised. One such way is by providing the devices to be foldable. As an example, devices such as smartphones and tablet computers may have foldable bodies and displays.

Examples disclosed herein provide a hinge for use in a foldable component. The foldable component can be, for example, a foldable display unit or a flexible screen assembly for use with an electronic device. The foldable component can include a flexible element, such as a flexible screen, coupled to and supported by the hinge. For example, the flexible element can have a folding edge along which the flexible element can be folded. In other words, the folding edge folds when the flexible element is folded. The hinge can be coupled to the flexible element to longitudinally extend along the folding edge of the flexible element. Further, the hinge can be bent and folded for folding the flexible element while using the foldable component. As an example, the hinge is a durable component. Therefore, even after prolonged folding and bending of the hinge, the hinge can operate reliably when used for operation along with the foldable component.

Figure 1B:
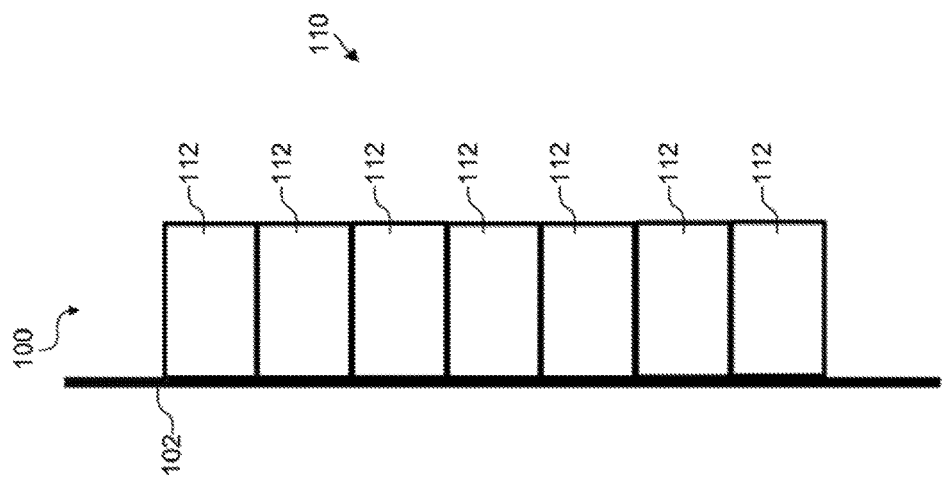
FIGS. 1A-B illustrate a foldable display unit in a folded and unfolded state, respectively, according to an example.
Figure 1A:
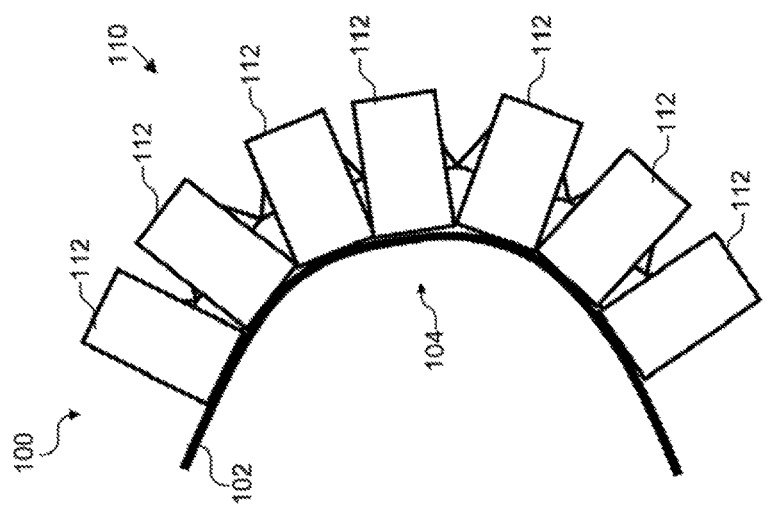

With reference to the figures, FIGS. 1A-B illustrate a foldable display unit 100 in a folded and unfolded state, respectively, according to an example. As illustrated, the foldable display unit 100 includes a flexible display component 102 that is foldable. For instance, the flexible display component 102 can have a folding edge, indicated by arrow 104, along which the flexible display component 102 can be folded. As an example, the flexible display component 102 can be a flexible mirror, or a flexible element, such as a flexible screen.

Further, the foldable display unit 100 can include a hinge 110 extending longitudinally along the folding edge of the flexible display component 102. As an example, the hinge 110 can be used in the foldable display unit 100 and bent for folding the foldable display unit 100. The hinge 110 can support the flexible display component 102 and securely hold the flexible display component 102, for instance, in the folded and unfolded state, as illustrated. The hinge 110, in accordance with the present subject matter, is durable and can operate effectively even over prolonged usage.

As illustrated, the hinge 110 can include a plurality of brackets 112. As will be further described, each bracket 112 from among the plurality of brackets 112 can be operably coupled to an adjacent bracket 112 and can abut against the adjacent bracket 112. Further, an assembly of the brackets 112 can be folded into an arcuate shape, as illustrated in FIG. 1A. When folded in the arcuate shape, each bracket 112 can be supported by and locked against the adjacent bracket 112, to provide rigidity for maintaining the hinge 110 in the folded condition. As an example, each bracket 112 may be coupled to the flexible display component 102 using a coupler. For instance, each bracket 112 can be coupled to the flexible display component 102 using a fastener, such as a nut and bolt, a screw, a rivet, or using an adhesive, or a combination thereof.

Referring to FIG. 1B, when the hinge 110 is in an unfolded state, edges of brackets 112 from the plurality of brackets 112 may abut against corresponding edges of adjacent brackets 112, effectively acting as a stopper to limit the unfolding of the foldable display unit 100 to 180 degrees, as illustrated. As an example, an abutting surface of each of the brackets 112, i.e., the surface at which one bracket 112 abuts against the adjacent bracket 112, can be treated with surface hardening processes or, in other words, can be surface treated to harden the abutting surface. For instance, in case the brackets 112 are comprised of a metal or a metal alloy, the abutting surface of each bracket 112 can be hardened by case hardening. In another example, the abutting surface of each bracket 112 can be coated with a hard coating, using techniques, such as physical vapor deposition (PVD), chemical vapor deposition (CVD), and spray coating. For instance, the hard coating can generally include boron nitride, titanium nitride (TiN), aluminum nitride, chromium nitride (CrN), aluminum titanium nitride (AlTiN), titanium aluminum nitride (TiAlN), titanium cyanide (TiCN), TiAlSiN, and carbon exhibiting properties similar to diamond.

Figure 2B:
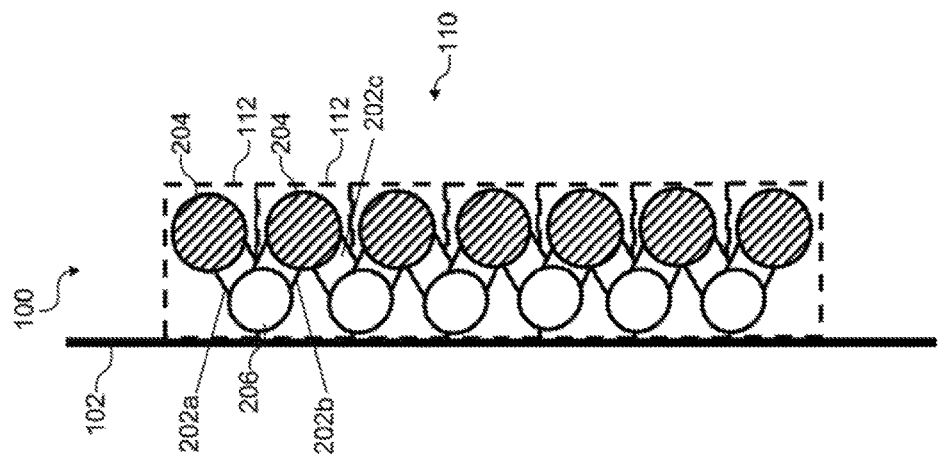
Figure 2A:
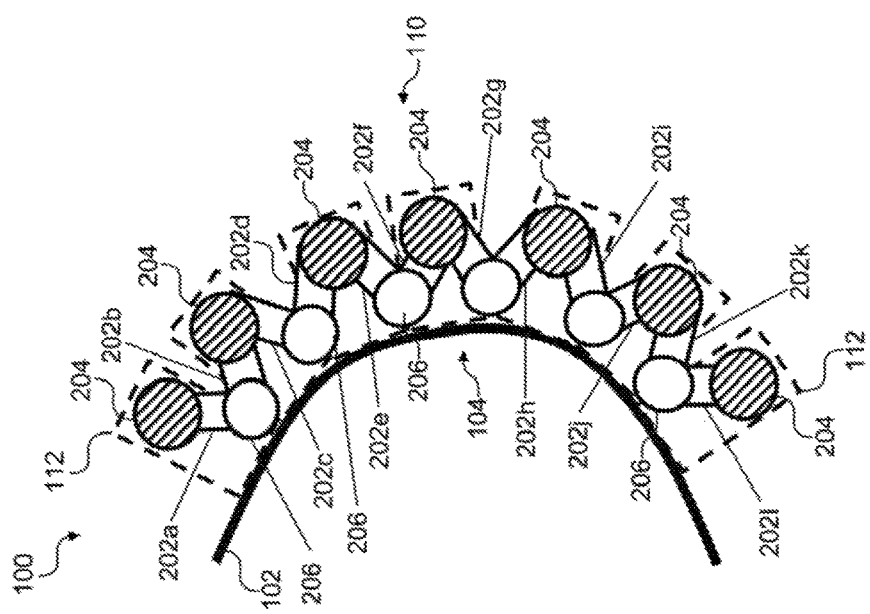

FIGS. 2A-B illustrate components of the foldable display unit 100 in a folded and unfolded state, respectively, for operably coupling the plurality of brackets 112 to each other, according to an example. As illustrated, the hinge 110 includes a plurality of links 202a-l for operably coupling the plurality of brackets 112 to each other. As an example, the links 202a-l may be rotatably connected to each other by a first set of axes 204 according to a first frictional value, and a second set of axes 206 according to a second frictional value less than the first frictional value.

Referring to FIG. 2A, a first end of link 202b is rotatably connected via axis 204 to an end of link 202c according to the first frictional value, and a second end of link 202b is rotatably connected via axis 206 to an end of link 202a according to the second frictional value. The two sets of axes 204, 206, with different frictional values, may allow for the hinge 110 of the foldable display unit 100 to fold and unfold in combination with the flexible display component 102, with high reliability after continuous stretching and bending of the hinge 110. The first and second sets of axes 204, 206 may include elements that provide a level of resistance of the rotation of the links around a particular axis. Examples of the elements include, but are not limited to, friction hinges, clutches, washers, or bands. As an example, the elements in the first set of axes 204 may provide a greater level of resistance compared to the elements in the second set of axes 206.

Referring to FIG. 2A, when the hinge 110 is folded into the arcuate shape, the plurality of brackets 112 are stretched, such that an angle is formed between the edges of a bracket 112 and an adjacent bracket 112 (e.g., also see FIG. 1A). As an example, links from the plurality of links 202a-l connected via axes 204 to adjacent links from the plurality of links 202a-l according to the first frictional value may remain fixed while links connected via axes 206 according to the second frictional value may rotate. As a result, as the plurality of brackets 112 are stretched when the hinge 110 is folded, the links may rotate solely around axes 206, and not around axes 204. Referring to FIG. 28, when the hinge 110 is in an unfolded state, edges of brackets 112 from the plurality of brackets 112 may abut against corresponding edges of adjacent brackets 112, effectively acting as a stopper to limit the unfolding of the foldable display unit 100 to 180 degrees, as illustrated.

It should be understood that examples described herein below may include various components and features. It should also be understood that, in the following description, numerous specific details are set forth to provide a thorough understanding of the examples. However, it should be understood that the examples may be practiced without limitations to these specific details. In some instances, well known methods and structures may not be described in detail to avoid unnecessarily obscuring the description of the examples. Also, the examples may be used in combination with each other.

Reference in the specification to "an example" or similar language means that a particular feature, structure, or characteristic described in connection with the example is included in at least one example, but not necessarily in other examples. The various instances of the phrase "in one example" or similar phrases in various places in the specification are not necessarily all referring to the same example.

It should be understood that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

What is claimed is:

1. A foldable display unit comprising:
 a flexible display component comprising a folding edge, wherein the flexible display component is foldable along the folding edge; and
 a hinge coupled to the flexible display component to support the flexible display component during folding, the hinge comprising:
  a plurality of brackets, wherein a bracket from the plurality of brackets is to operably couple to an adjacent bracket from the plurality of brackets, to be folded into an arcuate shape; and
  a plurality of links to operably couple the plurality of brackets to each other, wherein a first end of a first link from the plurality of links is rotatably connected to an end of a second link from the plurality of links according to a first frictional value, and a second end of the first link is rotatably connected to an end of a third link from the plurality of links according to a second frictional value less than the first frictional value.

2. The foldable display unit of claim 1, wherein, when the hinge is in an unfolded state, a first edge of the bracket from the plurality of brackets is to abut against a second edge of the adjacent bracket from the plurality of brackets.

3. The foldable display unit of claim 2, wherein an abutting surface of each bracket from the plurality of brackets is treated by a surface hardening process.

4. The foldable display unit of claim 2, wherein, when the hinge is folded into the arcuate shape, the plurality of brackets are stretched, wherein an angle is formed between the first edge of the bracket from the plurality of brackets and the second edge of the adjacent bracket from the plurality of brackets.

5. The foldable display unit of claim 1, wherein, when the hinge is folded into the arcuate shape, links from the plurality of links connected to adjacent links from the plurality of links according to the first frictional value are to remain fixed while links from the plurality of links connected to adjacent links from the plurality of links according to the second frictional value are to rotate.

6. The foldable display unit of claim 1, comprising couplers to couple the plurality of brackets to the flexible display component.

7. The foldable display unit of claim 6, wherein the couplers to couple the plurality of brackets to the flexible display component comprise the use of fasteners or an adhesive, or a combination thereof.

8. A hinge comprising:
 a plurality of brackets, wherein a bracket from the plurality of brackets is to operably couple to an adjacent bracket from the plurality of brackets, to be folded into an arcuate shape;
 a plurality of links to operably couple the plurality of brackets to each other, wherein a first end of a first link from the plurality of links is rotatably connected to an end of a second link from the plurality of links according to a first frictional value, and a second end of the first link is rotatably connected to an end of a third link from the plurality of links according to a second frictional value less than the first frictional value; and
 couplers to couple the plurality of brackets to a flexible element.

9. The hinge of claim 8, wherein, when the hinge is in an unfolded state, a first edge of the bracket from the plurality of brackets is to abut against a second edge of the adjacent bracket from the plurality of brackets.

10. The hinge of claim 9, wherein an abutting surface of each bracket from the plurality of brackets is treated by a surface hardening process.

11. The hinge of claim 9, wherein, when the hinge is folded into the arcuate shape, the plurality of brackets are stretched, wherein an angle is formed between the first edge of the bracket from the plurality of brackets and the second edge of the adjacent bracket from the plurality of brackets.

12. The hinge of claim 8, wherein the couplers to couple the plurality of brackets to the flexible element comprise the use of fasteners or an adhesive, or a combination thereof.

13. A foldable component comprising:
 a flexible element comprising a folding edge, wherein the flexible element is foldable along the folding edge; and
 a hinge coupled to the flexible element to support the flexible element during folding, wherein the hinge is to longitudinally extend along the folding edge, the hinge comprising:
  a plurality of brackets, wherein a bracket from the plurality of brackets is to operably couple to an adjacent bracket from the plurality of brackets, to be folded into an arcuate shape;

a plurality of links to operably couple the plurality of brackets to each other, wherein a first end of a first link from the plurality of links is rotatably connected to an end of a second link from the plurality of links according to a first frictional value, and a second end of the first link is rotatably connected to an end of a third link from the plurality of links according to a second frictional value less than the first frictional value; and couplers to couple the plurality of brackets to the flexible element.

14. The foldable component of claim 13, wherein, when the hinge is in an unfolded state, a first edge of the bracket from the plurality of brackets is to abut against a second edge of the adjacent bracket from the plurality of brackets.

15. The foldable component of claim 14, wherein, when the hinge is folded into the arcuate shape, the plurality of brackets are stretched, wherein an angle is formed between the first edge of the bracket from the plurality of brackets and the second edge of the adjacent bracket from the plurality of brackets.

* * * * *